United States Patent
Lin et al.

(10) Patent No.: US 10,261,369 B2
(45) Date of Patent: Apr. 16, 2019

(54) INTEGRATED CIRCUIT STRUCTURE, DISPLAY MODULE, AND INSPECTION METHOD THEREOF

(71) Applicant: AU OPTRONICS CORPORATION, Hsin-chu (TW)

(72) Inventors: Neng-Yi Lin, Hsin-chu (TW); Chien-Chih Liu, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 24 days.

(21) Appl. No.: 15/600,073

(22) Filed: May 19, 2017

(65) Prior Publication Data
US 2018/0188572 A1   Jul. 5, 2018

(30) Foreign Application Priority Data

Dec. 30, 2016  (TW) .............................. 105144239 A

(51) Int. Cl.
G02F 1/1345   (2006.01)
G09G 3/00    (2006.01)
H01L 21/66   (2006.01)
H01L 23/00   (2006.01)
(Continued)

(52) U.S. Cl.
CPC ............ *G02F 1/1345* (2013.01); *H01L 22/24* (2013.01); *H01L 24/13* (2013.01); *H01L 24/14* (2013.01); *H01L 24/73* (2013.01); *H01L 27/3297* (2013.01); *G09G 3/006* (2013.01); *G09G 3/3648* (2013.01); *H01L 2224/14134* (2013.01)

(58) Field of Classification Search
CPC ....... G02F 1/1345; H01L 24/13; H01L 24/73; H01L 22/24; H01L 24/10; G09G 3/006
See application file for complete search history.

(56) References Cited

U.S. PATENT DOCUMENTS

2002/0089634 A1   7/2002  Aruga et al.
2004/0174215 A1*  9/2004  Li .................. H03F 3/45219
                                                330/253
2014/0187088 A1   7/2014  Kim et al.
(Continued)

FOREIGN PATENT DOCUMENTS

| JP | 2009025044 A | 2/2009 |
|----|--------------|--------|
| TW | I239420 B    | 9/2005 |
| TW | 200948048 A  | 11/2009 |

OTHER PUBLICATIONS

Office Action issued by (TIPO) Intellectual Property Office, Ministry of Economic Affairs, R. O. C. dated Mar. 9, 2018 for Application No. 105144239, Taiwan.

*Primary Examiner* — Huy Q Phan
*Assistant Examiner* — Zannatul Ferdous
(74) *Attorney, Agent, or Firm* — Tim Tingkang Xia, Esq.; Locke Lord LLP

(57) ABSTRACT

An integrated circuit has a first pin, a voltage outputting circuit electrically connected to the first pin, a second pin, a current receiving circuit electrically connected to the second pin and a comparing circuit electrically connected to the current receiving circuit. The voltage outputting circuit outputs a first current which flow into the current receiving circuit through the second pin. After receiving the first current, the current receiving circuit outputs an output current to the comparing circuit and the comparing circuit compares the output current and a reference current to output an output signal.

14 Claims, 9 Drawing Sheets

(51) Int. Cl.
*H01L 27/32* (2006.01)
*G09G 3/36* (2006.01)

(56) References Cited

U.S. PATENT DOCUMENTS

| | | | |
|---|---|---|---|
| 2015/0115020 A1* | 4/2015 | Taniguro | H01L 24/11 |
| | | | 228/180.22 |
| 2015/0279258 A1* | 10/2015 | Shin | G09G 3/006 |
| | | | 324/755.01 |
| 2015/0325549 A1* | 11/2015 | Hsu | H01L 24/81 |
| | | | 257/676 |
| 2016/0334272 A1* | 11/2016 | Saito | G01J 1/44 |
| 2017/0074923 A1* | 3/2017 | Su | H01L 22/34 |

* cited by examiner

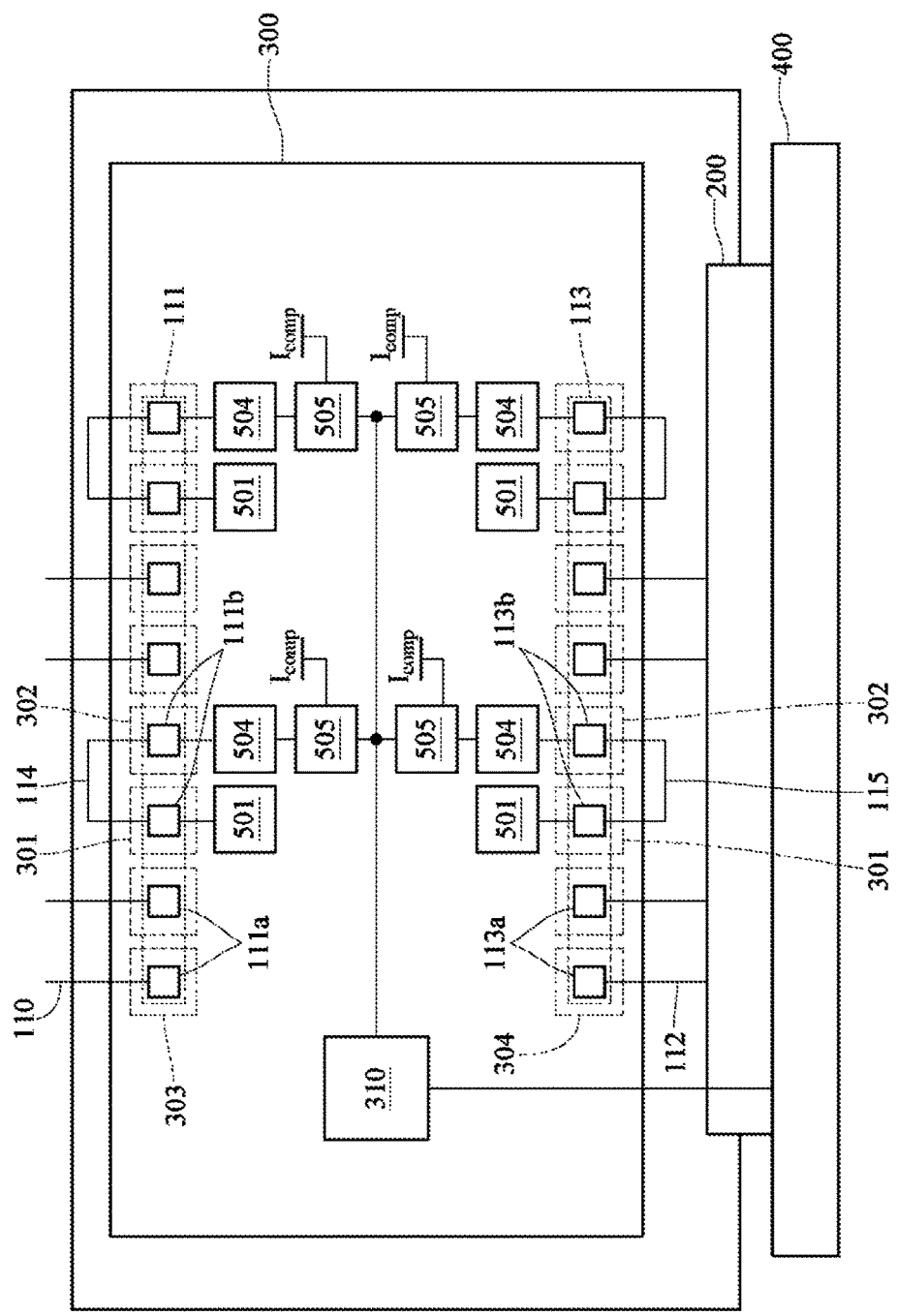

us 10,261,369 B2

1

INTEGRATED CIRCUIT STRUCTURE, DISPLAY MODULE, AND INSPECTION METHOD THEREOF

CROSS-REFERENCE TO RELATED PATENT APPLICATION

This application claims the benefit of priority to Taiwan Patent Application No. 105144239, filed Dec. 30, 2016. The entire content of the above identified application is incorporated herein by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present disclosure relates to an integrated circuit, and particularly, to an integrated circuit for a user to judge information about connection conditions of pins.

BACKGROUND

In the conventional art, during assembling of a liquid crystal display, it is often necessary to inspect connection conditions of pins and connection pads of the integrated circuit. However, as the integrated circuit is small-sized, if wiring is relatively complicated, the manner of measuring resistance by using an ammeter is more difficult and complicated. Therefore, a problem to be solved exists in how the connection conditions of the pins of the integrated circuit may be effectively determined.

SUMMARY

An embodiment of the present disclosure discloses an integrated circuit. The integrated circuit has a first pin, a voltage outputting circuit electrically connected to the first pin and outputting a first current, a second pin, a current receiving circuit electrically connected to the second pin, receiving the first current and outputting an output current, and a comparing circuit electrically connected to the current receiving circuit. The comparing circuit compares the output current and a reference current to output an output signal.

Another embodiment of the present disclosure discloses a bonding state test method of driving an integrated circuit by a liquid crystal display, the test method comprising: setting the integrated circuit to operate in a bonding state test mode, setting a bonding impedance threshold, generating a reference current corresponding to the bonding impedance threshold; selecting a position to be tested, the integrated circuit outputting a first current through a first pin, the integrated circuit receiving the first current flowing in from a second pin and generating an output current, and if the output current is greater than the reference current, outputting a first signal; if the output current is less than the reference current, outputting a second signal.

A further embodiment of the present disclosure discloses a liquid crystal display, comprising a substrate, a first group of bumps located on the substrate, a second group of bumps located on the substrate and adjacent to the first group of bumps, and an integrated circuit having a plurality of first pins and a plurality of second pins, wherein the first group of bumps has at least two electrically connected bumps, the second group of bumps has at least two electrically connected bumps, and the two electrically connected bumps in the first group of bumps and the two electrically connected bumps in the second group of bumps are electrically connected to the first pins and the second pins of the corresponding integrated circuit respectively.

Based on the above, the integrated circuit and the method for judging connection conditions of pins and connection pads provided in the embodiments of the present disclosure can rapidly and effectively measure connection conditions of pins and connection pads of the integrated circuit. Moreover, as the integrated circuit calculates impedance to judge the connection conditions of pins and connection pads by means of current comparison, the accuracy of calculating bonding impedance is better, and at the same time, a smaller area inside the integrated circuit is occupied, which can reduce complexity of the circuit and the cost of the integrated circuit.

BRIEF DESCRIPTION OF THE DRAWINGS

FIG. 3A is a schematic diagram of a combination of the display panel and an integrated circuit according to a first embodiment of the present disclosure.

DETAILED DESCRIPTION

Figure 1:
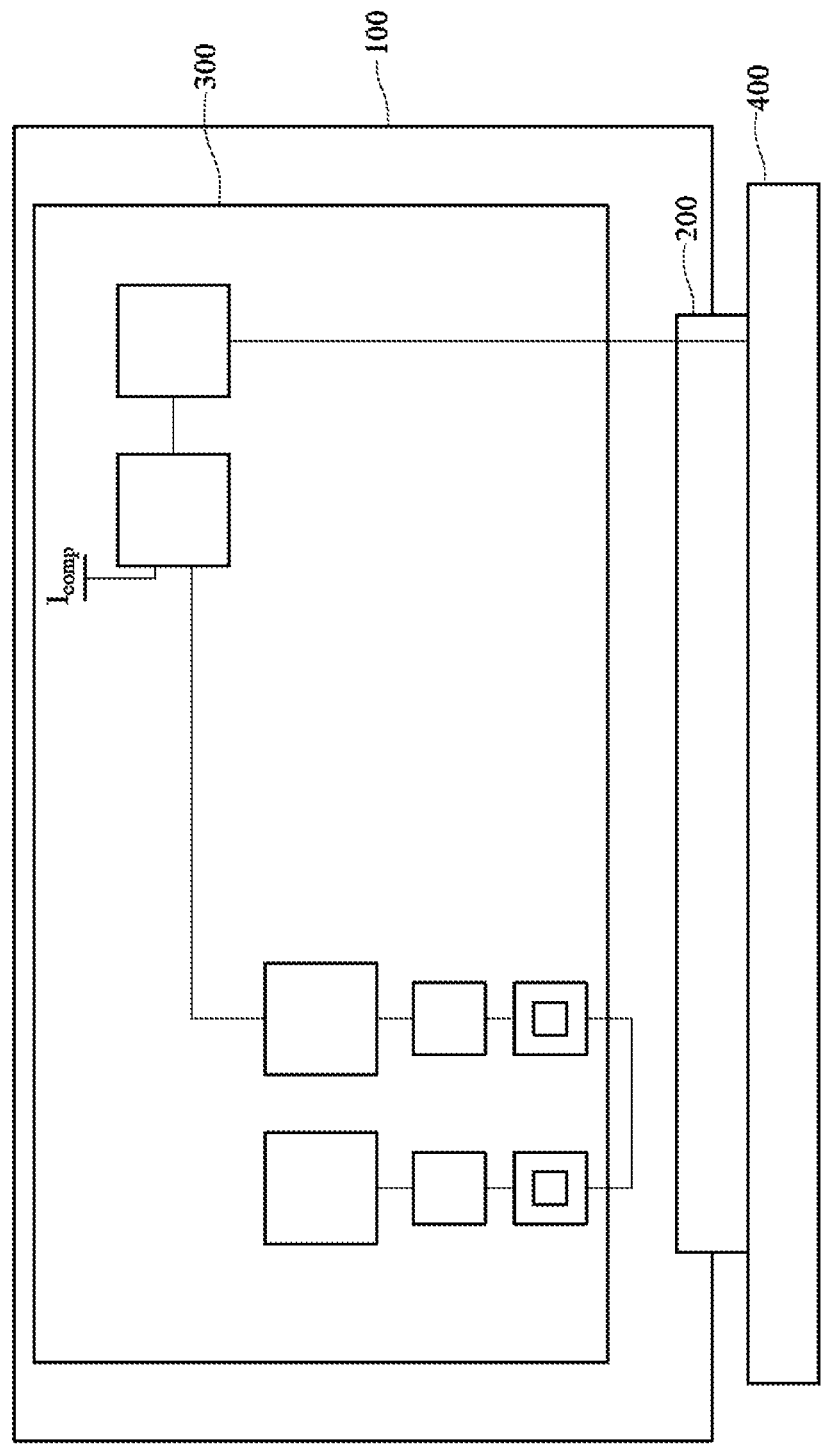
FIG. 1 is a schematic diagram of a bonding impedance inspection system of a display.

Embodiments accompanied with figures are described in detail below, to better understand the aspects of the application. However, the embodiments provided are not intended to limit the scope of the present disclosure. The description of structures and operations are not intended to limit the order of execution. Any structure formed by recombining elements shall fall within the scope of the present disclosure as long as an equivalent apparatus can be generated. In addition, according to the standard in the industry and common practice, the figures are merely provided for the purpose of description, but are not drawn to scale. In effect, sizes of various features may be increased or decreased arbitrarily to facilitate description. Like or similar elements are denoted by like reference numerals in the following description to facilitate understanding.

Unless otherwise specified, all the terms used throughout the specification and the claims generally have the same meaning as is commonly used in the field, in the content of the present disclosure and in special content. Some terms used for describing the present disclosure will be discussed below or in other parts of this specification, so as to provide additional guidance for persons skilled in the art in addition to the description of the present disclosure.

Besides, the terms "comprise", "include", "have" and "contain" as used herein are all open terms, that is, mean "including, but not limited to". Also, the term "and/or" as used herein includes any or all combinations of one or more items in related listed items.

As used herein, when an element is referred to as "connected" or "coupled", it may mean "electrically connected" or "electrically coupled". The term "connected" or "coupled" may mean that two or more elements co-operate or interact with each other.

The electrical connection described in the present disclosure is illustrated as direct electrical connection or indirect electrical connection, the indirect electrical connection is electrical connection manners other than the direct electrical connection, and the indirect electrical connection is, for example, other members (e.g., circuits, transistors, capacitors, diodes, resistors or other electronic elements) in an electrical connection path, but are not intended to limit the present invention. Further, although the terms "first", "second" and the like as used herein describe different elements, the terms are only used for distinguishing r elements or operations described with like technical terms. Unless clearly indicated in the context, the terms neither necessarily refer to or imply an order or sequence nor are intended to limit the present invention.

Figure 2:
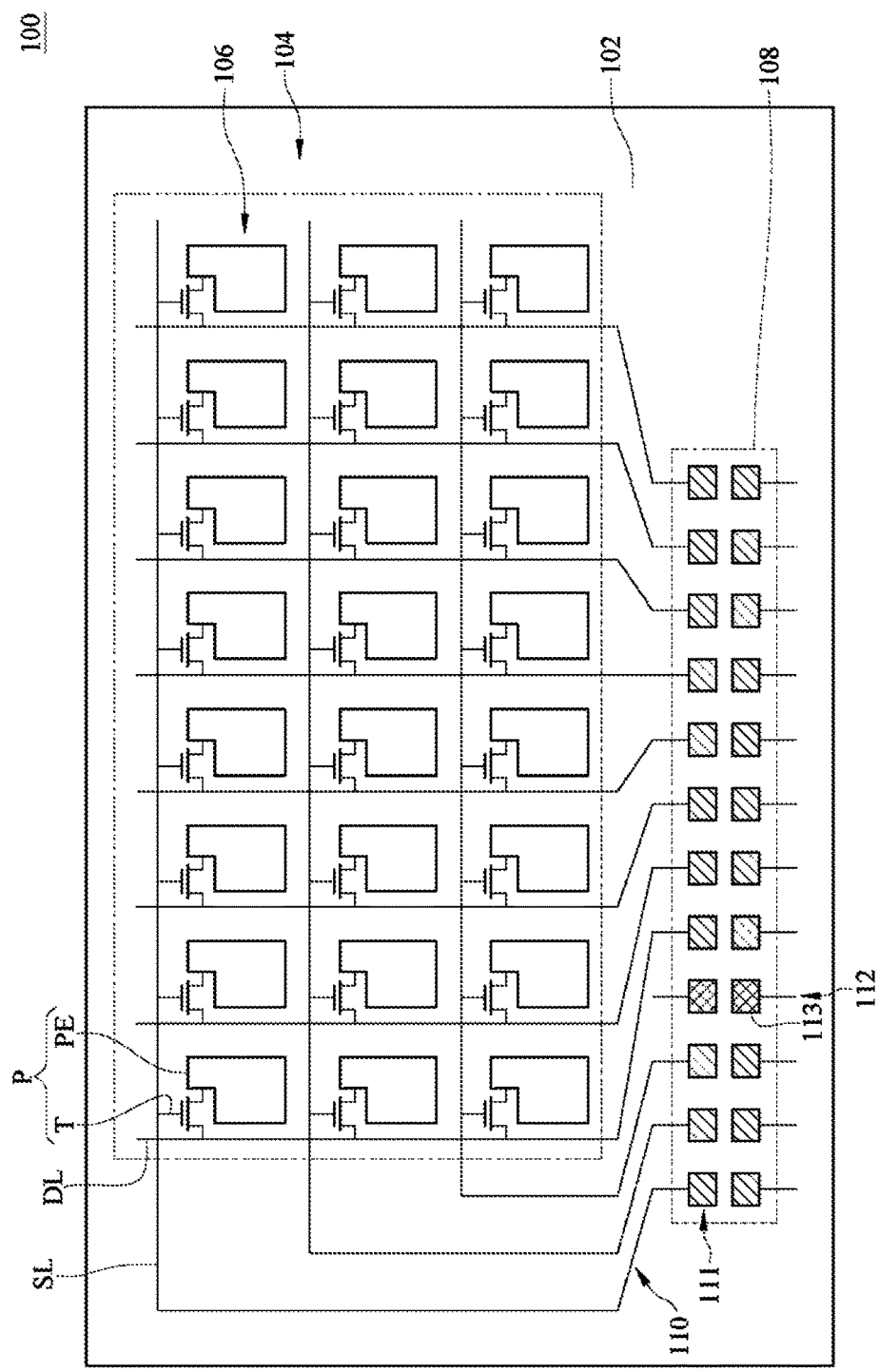
FIG. 2 is a schematic diagram of a display panel.

FIG. 1 is a schematic diagram of a bonding impedance inspection system of a display according to an embodiment of the present invention, FIG. 2 is a schematic diagram of a display panel of FIG. 1, and FIG. 3 is a schematic diagram of a combination of the display panel of FIG. 1 and an integrated circuit. Referring to FIG. 1, FIG. 2 and FIG. 3 at the same time, the bonding impedance inspection system of the display according to this embodiment includes a display panel 100, at least one circuit board 200, at least one driver chip 300 and at least one system board 400.

The display panel 100 has multiple first wires 110 electrically connected to a first group of bumps (connection pads, OLB) 111 and multiple second wires 112 electrically connected to a second group of bumps 113 (connection pads, ILB), the first wires 110 are used for outputting various signals to a circuit and pixels at an inner side of the display panel, that is, the first wires extend towards the direction of a display region and are electrically connected to a line in the display region, and the second wires 112 are used for receiving signals input from the outside, for example, the second wires are electrically connected to the system board 400, that is, extend towards a reverse direction of the display region, as shown in FIG. 3.

Specifically, referring to FIG. 2, the display panel 100 includes a substrate 102, multiple scan lines SL, multiple data lines DL and multiple pixel structures P, multiple first wires 110 and multiple second wires 112. The display panel, for example, may be a liquid crystal display panel, an organic light-emitting display panel, an electrophoretic display panel or a plasma display panel and so on.

The substrate 102 may be made of glass, quartz, an organic polymer, or an opaque/reflective material (e.g., a conductive material, metal, wafer, ceramics, or other suitable materials) or other suitable materials. The substrate 102 has a bonding region 108, a display region 106 and a non-display region 104.

The scan lines SL and the data lines DL are disposed on the substrate 102, and extend from the display region 106 to the non-display region 104. The pixel structures P are disposed in the display region 106 of the substrate 102, and each pixel structure P is electrically connected to the corresponding scan line SL and data line DL. According to this embodiment, the pixel structures P each include a switch element T and a pixel electrode PE, the switch elements T are electrically connected to the scan lines SL and the data lines DL, and the pixel electrodes PE are electrically connected to the switch elements T. The switch elements T may be bottom gate-type thin film transistors or top gate-type thin film transistors. The pixel electrodes PE may be transmission pixel electrodes, reflection pixel electrodes or semi-transmission and semi-reflection pixel electrodes.

In addition, the scan lines SL and the data lines DL, after extending from the display region 106 to the non-display region 104, are electrically connected to the corresponding first wires 110 respectively, and electrically connected to the driver chip 300. The bonding region 108 marked in FIG. 2 represents a chip bonding region, in other words, the driver chip 300 is actually bonded in the bonding region 108.

Referring to FIG. 3A, FIG. 3A shows an embodiment of the present disclosure. The driver chip 300 includes multiple voltage outputting circuits 501, multiple current receiving circuits 504 and multiple comparing circuit 505, which are directly integrated into the driver chip 300. In other embodiments, they may not be integrated into the single driver chip 300. The driver chip 300 also has at least one first pin 301 electrically connected to the corresponding voltage outputting circuits 501, at least one second pin 302 electrically connected to the corresponding current receiving circuits 504, multiple first connecting pins 303, and multiple second connecting pins 304. The multiple first connecting pins 303 are electrically connected to the first wires 110 of the display panel 100 and the multiple second connecting pins 304 are electrically connected to the second wires 112. According to this embodiment, the connecting pins 303 of the driver chip 300 are electrically connected to the first wires 110 through the first group of bumps 111 of the display panel 100, and the second pins 304 of the driver chip 300 are electrically connected to the second wires 112 through the second group of bumps 113 of the display panel 100. The first group of bumps 111 have first bumps 111a and second bumps 111b, the first bumps 111a are used for electrically coupling the first connecting pins 303, wherein two adjacent second bumps 111b in an X direction, in general the X direction is from left to right, are electrically connected through third wires 114, and one of the two electrically connected second bumps 111b is electrically connected to the first pins 301 and the other one is electrically connected to the second pins 302, but the two electrically connected second bumps 111b are not electrically connected to the first wires 110. Alternatively, in other embodiments, the second bumps 111b may be adjacent in a Y direction, in general the Y direction is from bottom to up, or electrically connected after crossing multiple first bumps 111a. The second group of bumps 113 have first bumps 113a and second bumps 113b, the first bumps 113a are used for electrically connected the second connecting pins 304, two adjacent second bumps 113b in an X direction are electrically connected through fourth wires 115, and one of the two electrically connected second bumps 113b is electrically connected to the first pins 301 and the other one is electrically connected to the second pins 302, but the two electrically connected second bumps 113b are not electrically connected to the second wires 112. Alternatively, in other embodiments, the second bumps 113b may be adjacent in a Y direction or electrically connected after crossing multiple first bumps 113a.

Figure 3B:
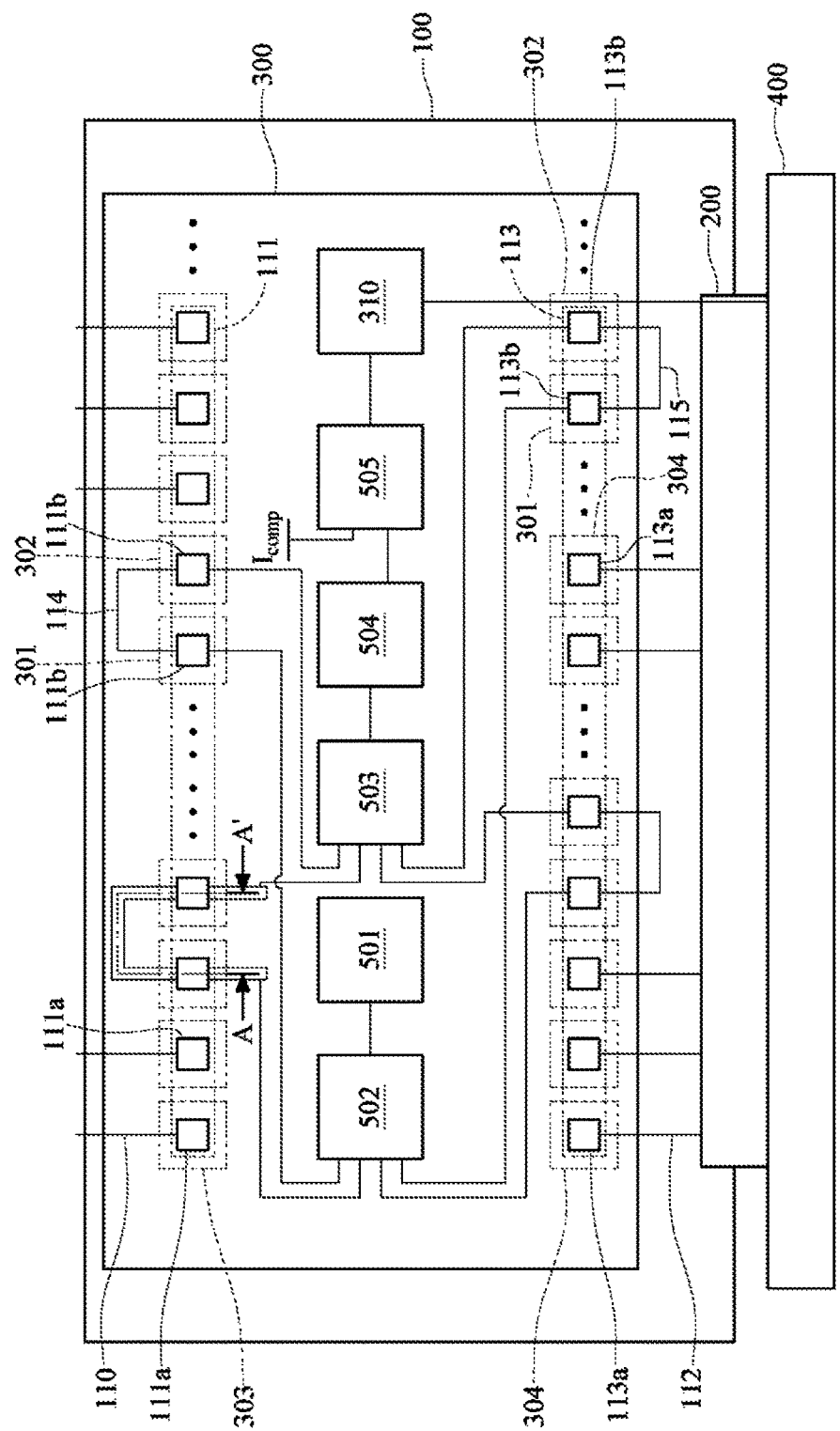
FIG. 3B is a schematic diagram of a combination of the display panel and an integrated circuit according to a second embodiment of the present disclosure.

Referring to FIG. 3B, FIG. 3B shows another embodiment of the present disclosure. The driver chip 300 includes a voltage outputting circuit 501, a first selection circuit 502, a second selection circuit 503, a current receiving circuit 504 and a comparing circuit 505, which are directly integrated into the driver chip 300. In other embodiments, they may not be integrated into the single driver chip 300. The driver chip 300 also has at least one first pin 301, at least one second pin 302, multiple first connecting pins 303, and multiple second connecting pins 304. The multiple first connecting pins 303 are electrically connected to the first wires 110 of the display panel 100 and the multiple second connecting pins 304 are electrically connected to the second wires 112. According to this embodiment, the connecting pins 303 of the driver chip 300 are electrically connected to the first wires 110 through the first group of bumps 111 of the display panel 100, and the second pins 304 of the driver chip 300 are electrically connected to the second wires 112 through the second group of bumps 113 of the display panel 100. The first group of bumps 111 have first bumps 111a and second bumps 111b, the first bumps 111a are used for electrically coupling the first connecting pins 303, wherein two adjacent second bumps 111b in an X direction are electrically connected through third wires 114, and one of the two electrically connected second bumps 111b is electrically connected to the first pins 301 and the other one is electrically connected to the second pins 302, but the two electrically connected second bumps 111b are not electrically connected to the first wires 110. Alternatively, in other embodiments, the second bumps 111b may be adjacent in a Y direction or electrically connected after crossing multiple first bumps 111a. The second group of bumps 113 have first bumps 113a and second bumps 113b, the first bumps 113a are used for electrically coupling the second connecting pins 304, two adjacent second bumps 113b in an x direction are electrically connected through fourth wires 115, and one of the two electrically connected second bumps 113b is electrically connected to the first pins 301 and the other one is electrically connected to the second pins 302, but the two electrically connected second bumps 113b are not electrically connected to the second wires 112. Alternatively, in other embodiments, the second bumps 113b may be adjacent in a y direction or electrically connected after crossing multiple first bumps 113a.

Figure 4:
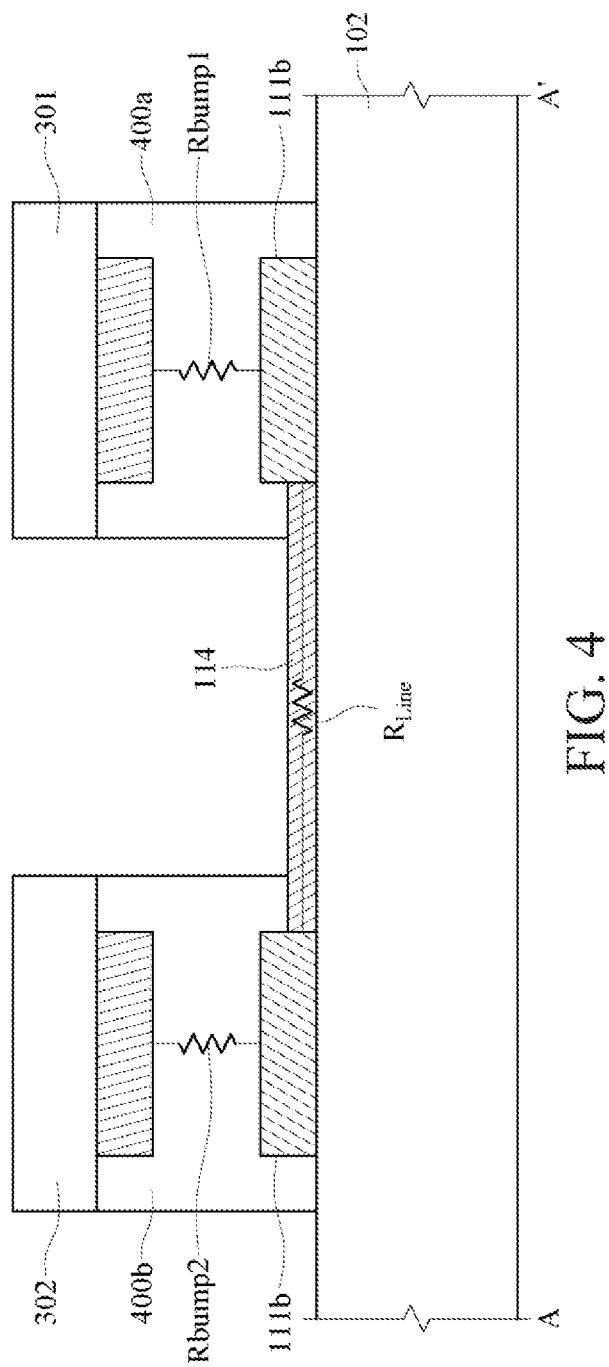
FIG. 4 is a sectional diagram of two electrically connected second bumps along A-A'.

Referring to FIG. 4, FIG. 4 is a sectional diagram of the two electrically connected second bumps 111b of FIG. 3B along A-A'. The first pins 301 of the integrated circuit 300 are electrically connected to one of two second bumps 111b in the first group of bumps which are electrically connected through the third wires 114, and the second pins 302 are electrically connected to the other second bump 111b. In this embodiment, the second bump 111b is generally electrically connected to the first pins 301 or the second pins 302 by using anisotropic conductive adhesive (ACF) 400b.

According to this embodiment, the driver chip 300 is bonded to the display panel 100 by means of ACF 400a and 400b, and the first pins 301 and the second pins 302 of the driver chip 300 are electrically connected to the corresponding second bumps 111b of the display panel 100. Specifically, after making of the display panel 100 is completed, the ACF 400a and 400b may be disposed in a particular region on the display panel 100, and then the driver chip 300 is placed on the ACF 400a and 400b. Then, the driver chip 300 is bonded to the display panel 100 by means of the ACF 400a and 400b through a thermal compression bonding program, and multiple first pins 301, multiple second pins 302, multiple first connecting pins 303 and multiple second connecting pins 304 of the driver chip 300 are electrically connected to the panel 100, which is well known to those skilled in the art and thus is not repeated herein.

Generally, each bonded pin and the bump on the display panel have a bonding impedance. In this embodiment, for example, the first pin 301 and the second bump 111b have a bonding impedance $R_{bump1}$, the second pin 302 and the second bump 111b have a bonding impedance $R_{bump2}$, and two third wires 114 connecting the second bump 111b have a line impedance $R_{line}$, and if the bonding program is abnormal, the bonding impedance between the driver chip 300 and the display panel 100 may be too high.

Figure 5A:
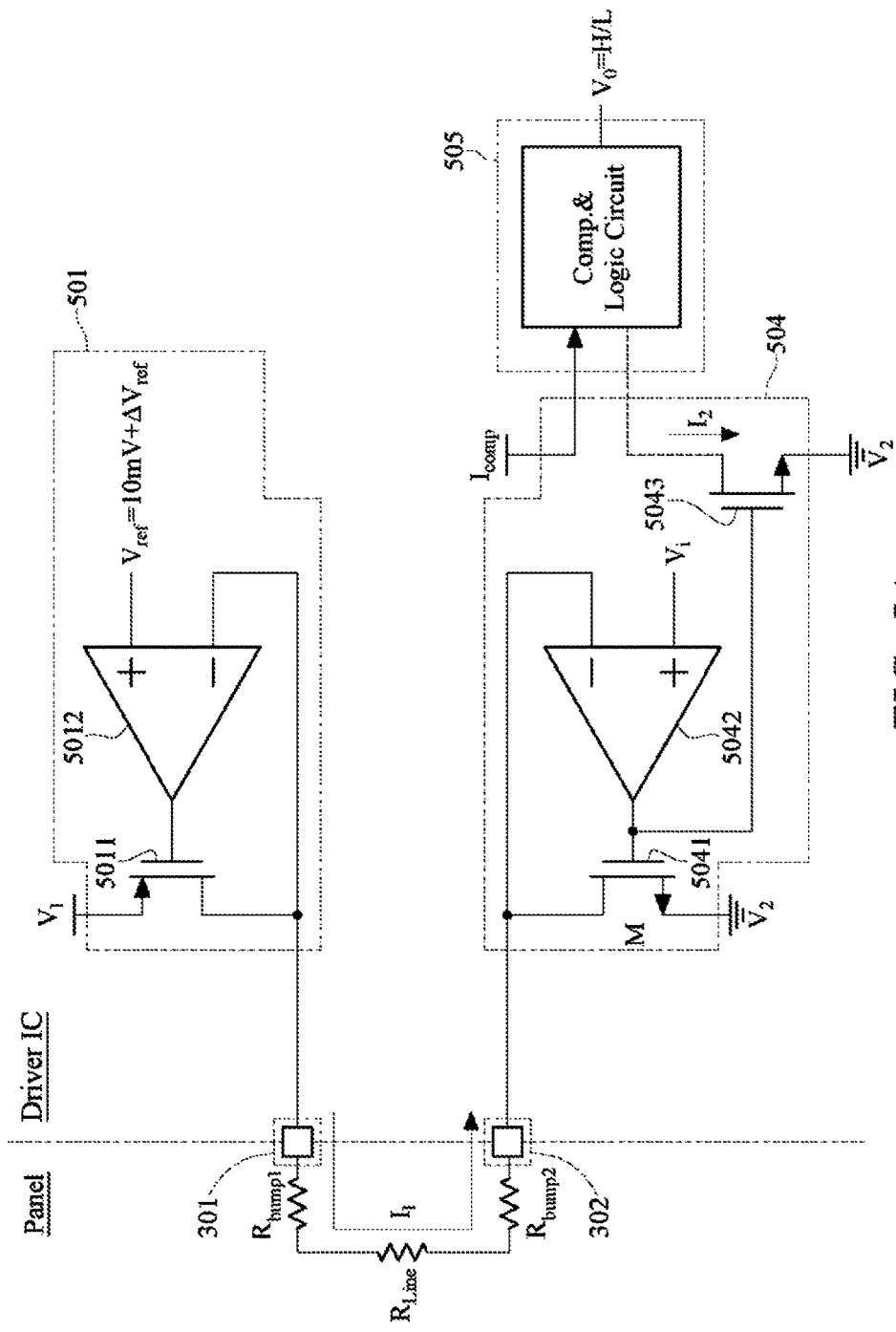
FIG. 5A is a partial schematic diagram of a test circuit in a driver chip according to the first embodiment of the present disclosure.
Figure 5B:
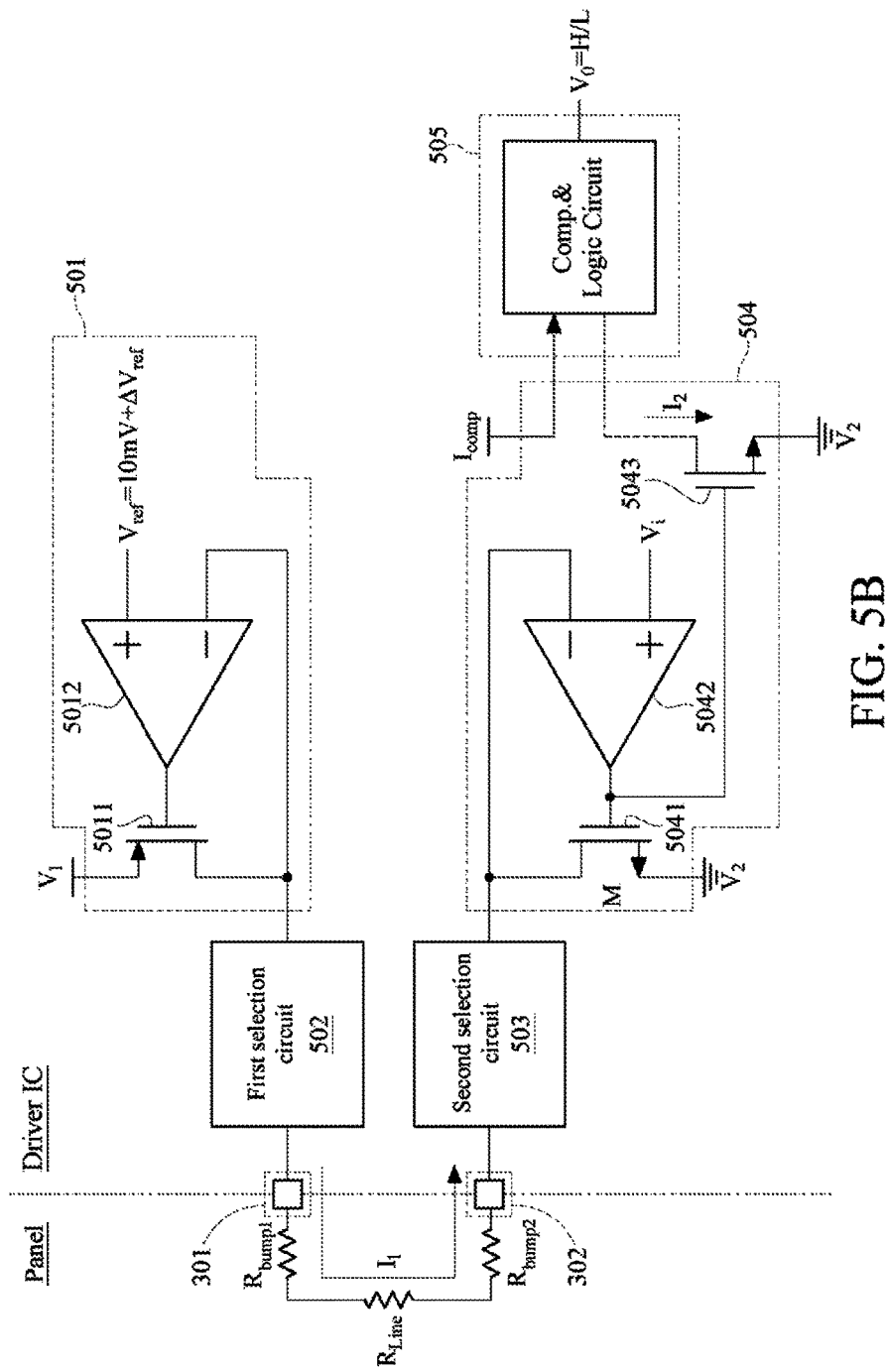
FIG. 5B is a partial schematic diagram of a test circuit in a driver chip according to the second embodiment of the present disclosure.

Referring to FIG. 5A, FIG. 5A is a partial schematic diagram of a test circuit in the driver chip 300. The voltage outputting circuit 501 is electrically connected to the first pins 301, the current receiving circuit 504 is electrically connected to the second pins 302, and the comparing circuit 505 is electrically connected to the current receiving circuit 504; FIG. 5B shows another embodiment of the test circuit in the driver chip 300. Because the first embodiment as shown in FIG. 5A and the second embodiment as shown in FIG. 5B have similar structures, the disclosure will only describe the structure of the second embodiment. Different from the structure as shown in FIG. 5A, the driver chip 300 has a first selection circuit 502 and a second selection circuit 503, the first selection circuit 502, for example, may be a multiplexer or any switch circuit, and is electrically connected to the first pins 301, and the voltage outputting circuit 501 is electrically connected to the first selection circuit 502. The second selection circuit 503, for example, may be a multiplexer or any switch circuit, and is electrically connected to the second pins 302, the current receiving circuit 504 is electrically connected to the second selection circuit 503, the voltage outputting circuit 501 has a third transistor 5011 and a second amplifier 5012, a first end of the third transistor 5011 is electrically connected to a first default voltage $V_1$, which, for example, may be a system high voltage $V_{dd}$, a second end of the third transistor 5011 is electrically connected to the first selection circuit 502 and a control end of the third transistor 5011 is electrically connected to an output end of the second amplifier 5012, a first end of the second amplifier 5012 is electrically connected to the first selection circuit 502 and a second end of the second amplifier 5012 is electrically connected to a second input voltage $V_{ref}$; the current receiving circuit 504 has a first transistor 5041, a first amplifier 5042 and a first transistor 5043, a first end of the first transistor 5041 is electrically connected to a second-default voltage $V_2$, which, for example, may be a system low voltage $V_{ss}$, a second end of the first transistor 5041 is electrically connected to the second selection circuit 503, a control end of the first transistor 5041 is electrically connected to an output end of the first amplifier 5042, and a first end of the first amplifier 5042 is electrically connected to the second selection circuit 503 and a second end of the first amplifier 5042 is electrically connected to a first input voltage Vi, which, for example, may be a system low voltage $V_{ss}$. A first end of the first transistor 5043 is electrically connected to the second default voltage $V_2$, which, for example, may be a system low voltage $V_{ss}$, a control end of the first transistor 5043 is electrically connected to the output end of the first amplifier 5042 and a second end of the first transistor 5043 outputs the output current $I_2$. As the first transistor 5041 and the third transistor 5043 form a current mirror architecture, an output current value may be adjusted by adjusting a ratio of the channel length to the width of the first and first transistors, for example, the second first transistor has a first channel length L1 and a first channel width W1, and the first transistor has a second channel length L2 and a second channel width W2 and W1/L1=N*W2/L2; then, the output current $I_2$ may be equal to N times of the first current $I_1$; the comparing circuit 505 receives an output current output by the first transistor 5043 and compares the output current with a reference current $I_{comp}$, the output signal Vo outputs a logic high level if the output current is greater than or equal to the reference current $I_{comp}$, and the output signal Vo outputs a logic low level if the output current is less than the reference current.

Figure 6:
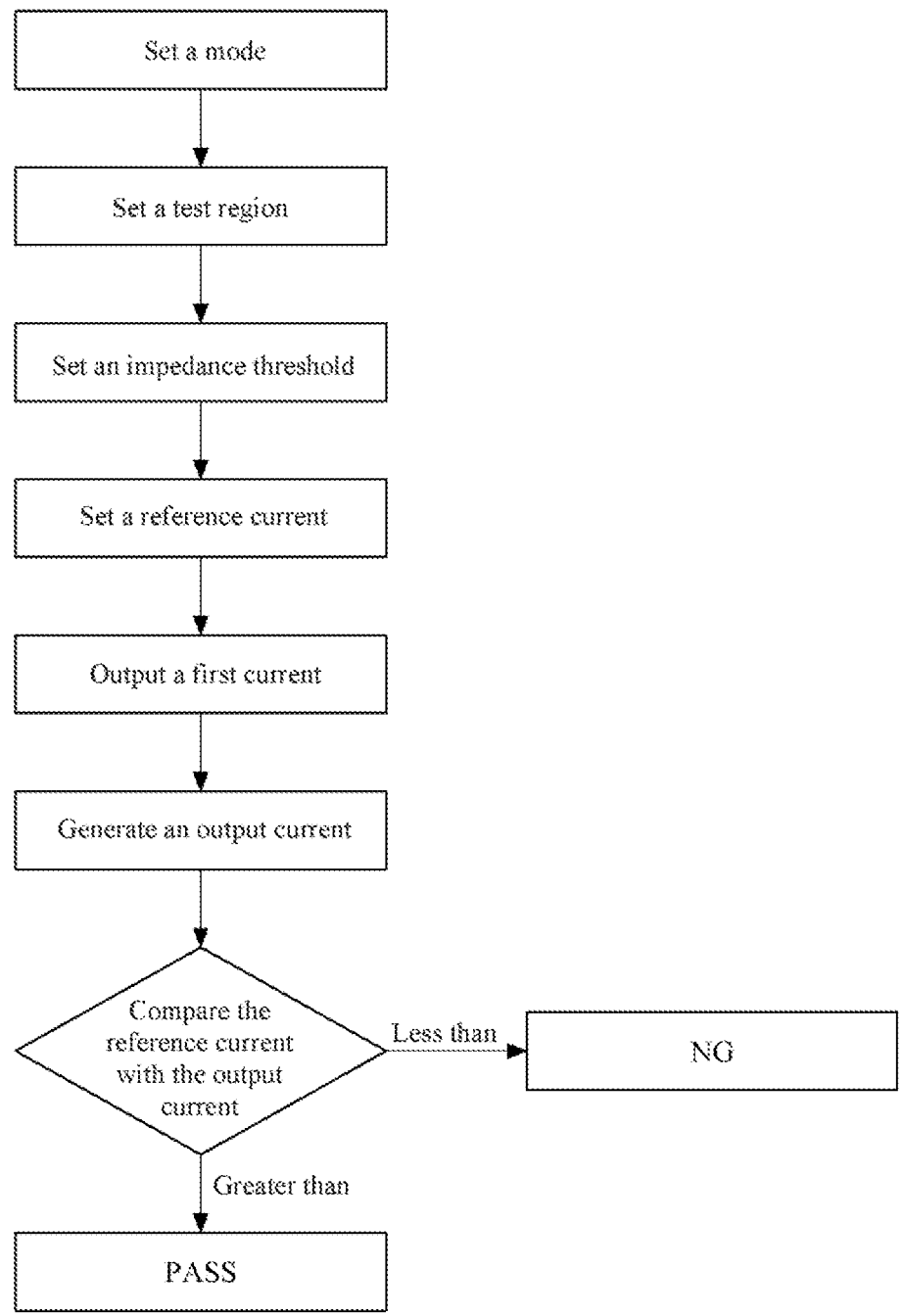
FIG. 6 is an operation flowchart.

Referring to FIG. 5 and FIG. 6, FIG. 6 is an operation flowchart, and an operation principle is described later. When it is necessary to detect a bonding condition of pins and bumps of an integrated circuit, the integrated circuit is set to operate in a test mode at first, next a test region is set, a first selection circuit and a second selection circuit are controlled, by outputting a selection signal, to connect first pins 301 and second pins 302 in a particular region respectively (i.e., connected to bumps in the particular region), as the bumps are electrically connected by wires, for example, the two second bumps 111b in the first group of bumps 111 in FIG. 3A are electrically connected by third wires 114 or the two second bumps 113b in the second group of bumps 113 are electrically connected by fourth wires 115, herein, the second bumps 111b are taken as an example, and thus the voltage outputting circuit 501, the second bumps 111b, the third wires 114, the second bumps 111b and the current receiving circuit 504 form a loop. As the wires have resistance $R_{line}$, the first pins, the second pins and the corresponding bumps have resistances $R_{bump1}$ and $_{bump2}$ respectively; in another embodiment, in FIG. 3B, the voltage outputting circuit 501, the first selection circuit 502, the second bumps 111b, the third wires 114, the second bumps 111b, the second selection circuit 503 and the current receiving circuit 504 form a loop, the impedance of the selection circuit is switch impedance and can be omitted, and thus there may be a first current $I_1$ $$I_1 = V_{ref}/(R_{line} + R_{bump1} + R_{bump2})$$

flowing out of the voltage outputting circuit 501 through the bumps 111b and the wires 114 and then flowing into the current receiving circuit 504. The current receiving circuit 504 has a current mirror formed by the first transistor 5041 and the second transistor 5043. As the channel width of the first transistor 5041 is M and the channel width of the second transistor 5043 is N, resulting in an output current $I_2$:

$$I_2 = N/M * I_1.$$

The output current $I_2$, after flowing to the comparing circuit 505, is compared with the set reference current $I_{comp}$. If the output current $I_2$ is less than the reference current $I_{comp}$, the output signal $V_o$ outputs a logic low level, which represents that the connection condition of the pins and the bumps is poor, and thus the resistance is higher than the standard one. If the output current is greater than or equal to the reference current, the output signal $V_o$ outputs a logic high level, which represents that the connection condition of the pins and the bumps is good, and thus the resistance is lower than or equal to the standard one. Next, the above steps are repeated to test bonding conditions in all regions, for example, on the premise that the channel width of the first transistor 5041 and the channel width of the second transistor 5043 are designed to be the same, suppose that a bonding impedance value is set as 20 ohm, $I_{comp}$=10 mV/20=0.5 mA, when an actual bonding impedance $R_{line}$+$R_{bump1}$+$R_{bump2}$=10 ohm, $I_1$=10/10=1 mA=$I_2$, $I_2$>$I_{comp}$, the comparing circuit 505 outputs a logic high level (H), indicating that the bonding impedance conforms to the specification; on the contrary, when the actual bonding impedance $R_{line}$+$R_{bump1}$+$R_{bump2}$=25 ohm, $I_1$=10 mV/25 ohm=0.4 mA=$I_2$, $I2$<$I_{comp}$, the comparing circuit 505 outputs a logic low level (L), indicating that the bonding impedance does not conform to the specification. It can be understood from the above formulas that the input current $I_{comp}$ is correlated with $V_{ref}$, and thus different bonding impedance values can be controlled by adjusting the second input voltage $V_{ref}$, to adapt to different detection standards to increase detection elasticity.

In this embodiment, the result of the comparing circuit 505 is directly output; in other embodiments, the driver chip 300 further comprises a buffer 310, for temporarily storing information of the comparing circuit 505, and upon completion of all the test, outputting the result to the system board 400.

Figure 7:
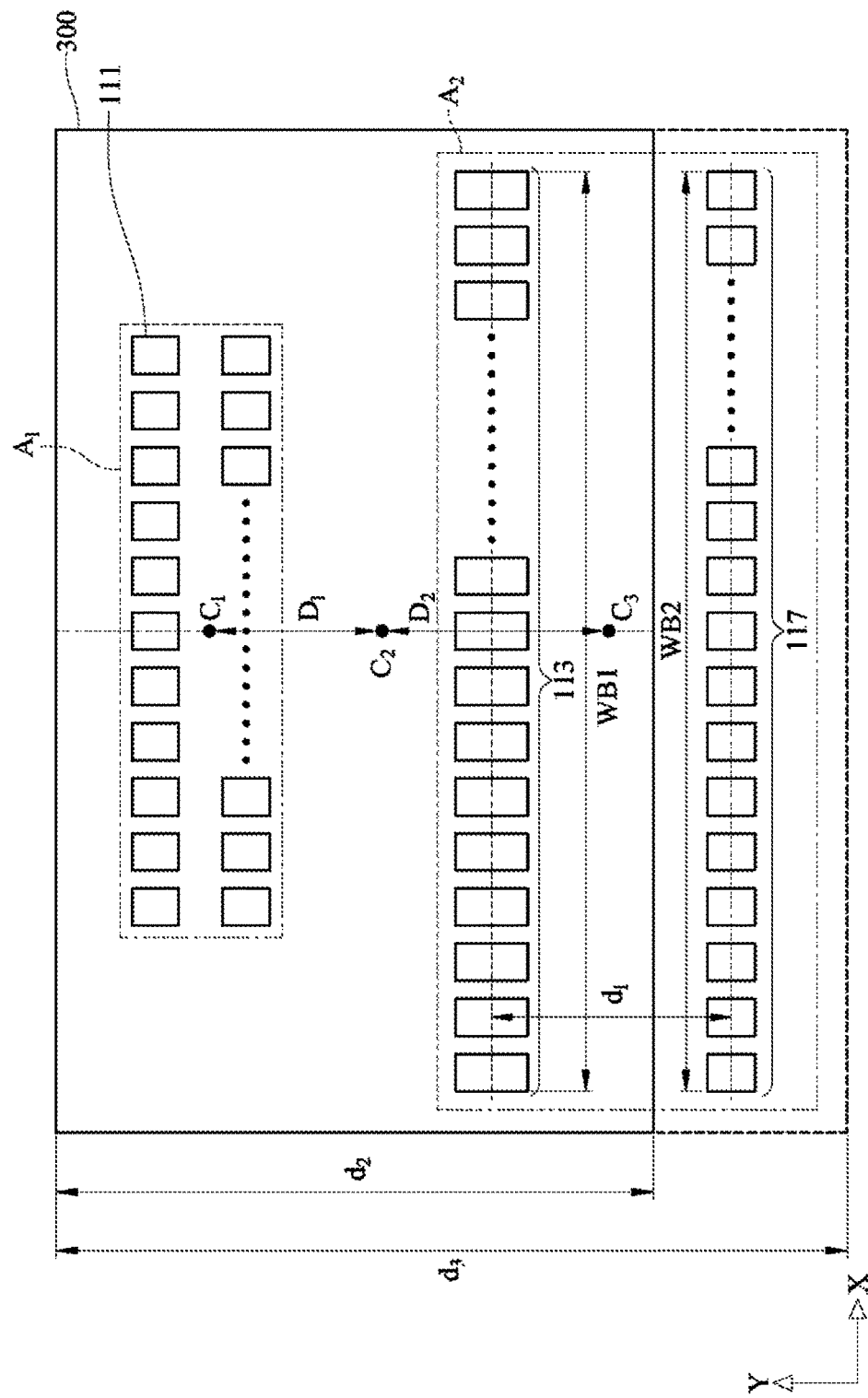
FIG. 7 is a schematic diagram of relative positions of a first group of bumps, a second group of bumps and a third group of bumps.

Referring to FIG. 7, in this embodiment, the display panel 100 further has a third group of bumps 117 disposed in a region adjacent to the second group of bumps 113, the length of the second group of bumps from the left boundary of the leftmost bump to the right boundary of the rightmost bump is WB1 and the length of the third group of bumps from the left boundary of the leftmost bump to the right boundary of the rightmost bump is WB2, and in addition, the number of the second group of bumps is not necessarily the same as that of the third group of bumps. In a known formula of torque, $$\text{torque} = \frac{\text{output pad total area } A_1 * \text{central distance to the integrated circuit } D_1}{\text{input pad total area } A_2 * \text{central distance to the integrated circuit } D_2}$$

Specifically, the first group of bumps 111 form the total area A1, the second group of bumps 113 and the third group of bumps 117 form the total area A2, the central distance D1 is a distance between the central position C1 of the first group of bumps 111 and the central position C2 of the integrated circuit 300, the central distance D2 is a distance between the central position C3 formed by the second group of bumps 113 and the third group of bumps 117 and the central position C2 of the integrated circuit 300, it can be known from the formula of torque that, when the input pad total area increases, the torque may decrease, while increasing the third group of bumps 117 substantially the same as the width of the second group of bumps 113 in the X direction may increase the input pad total area A2. In some embodiments, a memory may be used in the integrated circuit 300, and thus, to reduce the torque, the following formula has to be satisfied:

$$d_1 \leq d_3 - d_2.$$

A distance between the central position of the second group of bumps 113 and the central position of the third group of bumps 117 in the y direction is d1, the length of the integrated circuit 300 originally not using a memory is d2, the length of the integrated circuit 300 using a memory is d3, and with such design, the torque can be kept at a lower level to increase the yield of the bonding.

Although one driver chip 300 is depicted in this embodiment, the present disclosure does not limit the number of the driver chip 300. In fact, the number of the driver chip 300 is relevant to the size of the display panel 100. Therefore, the driver chip 300 may be at least one gate driver chip, at least one source driver chip, at least one integrated circuit chip or a combination thereof.

Based on the above, the integrated circuit and the method for judging connection conditions of pins of the integrated circuit provided in the embodiments of the present disclosure can effectively and accurately measure bonding conditions of pins and bumps of the integrated circuit. Therefore, after the reason for the failure is obtained, complexity of maintenance can be simplified. In addition, through the increased third group of bumps, the torque can be effectively reduced to increase the yield of the bonding.

The foregoing are merely preferred embodiments of the present invention, and any equivalent variations and modifications made according to the claims of the present invention shall fall within the scope of the present invention.

What is claimed is:

1. A liquid crystal display, comprising:
   a substrate;
   a first group of bumps located on the substrate;
   a second group of bumps located on the substrate and adjacent to the first group of bumps; and
   an integrated circuit having a plurality of first pins and a plurality of second pins;
   wherein the first group of bumps has at least two electrically connected bumps, the second group of bumps has at least two electrically connected bumps, and the two electrically connected bumps in the first group of bumps and the two electrically connected bumps in the second group of bumps are electrically connected to the first pins and the second pins of the corresponding integrated circuit respectively;
   wherein the integrated circuit comprises:
      a voltage outputting circuit electrically connected to the first pins;
      a current receiving circuit electrically connected to the second pins for outputting an output current; and
      a comparing circuit electrically connected to the voltage outputting circuit and comparing the output current with a reference current to output an output signal;
   wherein the current receiving circuit comprises:
      a first transistor having a first end electrically connected to a system low default voltage, a second end electrically connected to the second pins and a control end;
      a first amplifier having an output end electrically connected to the control end of the first transistor, a first end electrically connected to the second pins and a second end electrically connected to a first input voltage; and
      a second transistor having a first end electrically connected to the system low default voltage, a control end electrically connected to the output end of the first amplifier and a second end outputting the output current.

2. The liquid crystal display according to claim 1, wherein the first group of bumps comprise a first bump and a plurality of second bumps, the first bump is electrically connected to a first wire extending towards a first side of the substrate and electrically connected to a display region, and the at least two electrically connected bumps are the plurality of second bumps.

3. The liquid crystal display according to claim 2, wherein the first group of bumps are arranged along a first direction and the at least two electrically connected bumps in the first group are arranged along a second direction.

4. The liquid crystal display according to claim 1, wherein the second group of bumps comprise a first bump and a plurality of second bumps, the first bump is electrically connected to a second wire extending towards a second side of the substrate and electrically connected to a system board, and the at least two electrically connected bumps are the second bump.

5. The liquid crystal display according to claim 4, wherein the second group of bumps are arranged along a first direction and have a first width and the at least two electrically connected bumps in the second group are arranged along the first direction.

6. The liquid crystal display according to claim 1, wherein the integrated circuit further comprises:
   a first selection circuit having a first end for electrically connected to the first pins, and a second end for electrically connected to the voltage outputting circuit; and
   a second selection circuit having a first end for electrically connected to the second pins, and a second end for electrically connected to the current receiving circuit.

7. The liquid crystal display according to claim 1, wherein the voltage outputting circuit comprises:
   a third transistor having a first end electrically connected to a system high default voltage, a second end electrically connected to the first pins and a control end; and
   a second amplifier having an output end electrically connected to the control end of the third transistor, a first end electrically connected to the first pins and a second end electrically connected to a second input voltage.

8. The liquid crystal display according to claim 1, wherein the first transistor has a first channel length L1 and a first channel width W1, the second transistor has a second channel length L2 and a second channel width W2, and W1/L1=N*W2/L2.

9. The liquid crystal display according to claim 5, further comprising a third group of bumps disposed adjacent to the second group of bumps, wherein the third group of bumps has a width WB2, and the width WB2 is substantially equal to a width of the second group of bumps.

10. An integrated circuit, comprising:
    a first pin;
    a voltage outputting circuit electrically connected to the first pin;
    a second pin;
    a current receiving circuit electrically connected to the second pin; and
    a comparing circuit electrically connected to the voltage outputting circuit,
    wherein the current receiving circuit comprises:
       a first transistor having a first end electrically connected to a system low default voltage, a second end electrically connected to the second pin and a control end;
       a first amplifier having an output end electrically connected to the control end of the first transistor, a first end electrically connected to the second pin and a second end electrically connected to a first input voltage; and
       a second transistor having a first end electrically connected to the system low default voltage, a control end electrically connected to the output end of the first amplifier and a second end outputting the output current.

11. The integrated circuit according to claim 10, further comprising:
- a first selection circuit having a first end for electrically connected to the first pin, and a second end for electrically connected to the voltage outputting circuit; and
- a second selection circuit having a first end for electrically connected to the second pin, and a second end for electrically connected to the current receiving circuit.

12. The integrated circuit according to claim 10, wherein the voltage outputting circuit comprises:
- a third transistor having a first end electrically connected to a system high default voltage, a second end electrically connected to the first pin and a control end; and
- a second amplifier having an output end electrically connected to the control end of the third transistor, a first end electrically connected to the first pin and a second end electrically connected to a second input voltage.

13. The integrated circuit according to claim 10, wherein the first transistor has a first channel length L1 and a first channel width W1, the second transistor has a second channel length L2 and a second channel width W2, and W1/L1=N*W2/L2.

14. A bonding state test method of driving the integrated circuit according to claim 10 by a liquid crystal display, the test method comprising:
- setting the integrated circuit to operate in a bonding state test mode;
- setting a bonding impedance threshold;
- generating a reference current corresponding to the bonding impedance threshold;
- selecting a position to be tested;
- the integrated circuit outputting a first current through a first pin;
- the integrated circuit receiving the first current flowing in from a second pin and generating an output current; and
- if the output current is greater than the reference current, outputting a first signal;
- if the output current is less than the reference current, outputting a second signal.

* * * * *